United States Patent
Tamba

(10) Patent No.: US 7,629,809 B2
(45) Date of Patent: Dec. 8, 2009

(54) IC TESTER

(75) Inventor: Mamoru Tamba, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 12/255,407

(22) Filed: Oct. 21, 2008

(65) Prior Publication Data

US 2009/0134891 A1 May 28, 2009

(30) Foreign Application Priority Data

Nov. 28, 2007 (JP) .............................. 2007-306824

(51) Int. Cl.
*G01R 31/28* (2006.01)
*G01R 31/02* (2006.01)

(52) U.S. Cl. .................... 324/765; 324/158.1; 714/724

(58) Field of Classification Search ............. 324/158.1, 324/537, 754–765; 714/724, 735–737
See application file for complete search history.

(56) References Cited

U.S. PATENT DOCUMENTS

| | | | | |
|---|---|---|---|---|
| 4,517,512 A | * | 5/1985 | Petrich et al. ............... | 714/724 |
| 6,040,691 A | * | 3/2000 | Hanners et al. .......... | 324/158.1 |
| 6,625,557 B1 | * | 9/2003 | Perkins et al. ............... | 702/117 |
| 6,996,757 B2 | * | 2/2006 | Evans ........................ | 714/724 |
| 7,375,542 B2 | * | 5/2008 | Teneketges ................. | 324/765 |

FOREIGN PATENT DOCUMENTS

| | | |
|---|---|---|
| JP | 7-198792 A | 8/1995 |
| WO | 83/04315 A1 | 12/1983 |
| WO | 98/53330 A2 | 11/1998 |

* cited by examiner

*Primary Examiner*—Ernest F Karlsen
(74) *Attorney, Agent, or Firm*—Westerman, Hattori, Daniels & Adrian, LLP

(57) ABSTRACT

An object of the invention is to implement an IC tester wherein an analog test module can be provided at a test head while maintaining flexibility of the test head. The IC tester comprises an analog test module for testing an analog signal against the device under test. The analog test module comprises a main substrate, connected to the device under test, a first sub-substrate connected to the main substrate, the first sub-substrate comprising first analog circuits and first digital circuits electrically connected to the first analog circuits, wherein an analog test is conducted by the first analog circuits, and the first digital circuits, and a second sub-substrate connected to the main substrate, the second sub-substrate comprising second analog circuits and second digital circuits electrically connected to the second analog circuits, wherein an analog test is conducted by the second analog circuits, and the second digital circuits.

5 Claims, 2 Drawing Sheets

IC TESTER

FIELD OF THE INVENTION

The invention relates to an IC tester for testing a device under test such as, for example, an IC, an LSI, and so forth, and particularly, to an IC tester wherein an analog test module can be provided at a test head of the IC tester while maintaining flexibility of the test head.

BACKGROUND OF THE INVENTION

An IC tester is an instrument for imparting signals to a device under test (hereinafter referred to as a DUT) to thereby determine whether or not the DUT is non-defective on the basis of an output from the DUT. The IC tester generally comprises a main frame, and a test head, requiring a large installation area. Accordingly, with the IC tester for testing a DUT comprising digital circuits, circuits of the main frame are provided in the test head to thereby reduce the size of an installation area, as shown in the following Patent Documents 1 to 3, respectively. Since an IC mounted on a printed wiring board within the test head is highly integrated, having a large heat release value, the IC is provided with a heat sink for cooling, and so forth.

[Patent Document 1] JP 59 (1984)-500891T

[Patent Document 2] JP 7 (1995)-198792A

[Patent Document 3] JP 2002-503337T

Such an instrument as described is for use in testing a DUT provided with digital circuits, however, the DUT is provided with not only the digital circuits but also analog circuits which an analog signal is inputted to, or outputted from, so that the IC tester need be provided with an analog test module.

The analog circuits, however, cannot be highly integrated in comparison with the digital circuits, so that the printed wiring board needs a large installation area. Meanwhile, since it is required that the IC tester has flexibility, that is, capability of testing any kind of DUT, it becomes necessary to enable any kind of printed wiring board (a test module) to be mounted on the test head.

SUMMARY OF THE INVENTION

It is therefore an object of the invention to implement an IC tester wherein an analog test module can be provided at a test head while maintaining flexibility of the test head.

To that end, in accordance with one aspect of the invention, there is provided an IC tester for testing a device under test, comprising an analog test module for testing an analog signal against the device under test, mounted in a test head, the analog test module comprising a main substrate, the front end thereof being electrically connected to the device under test, a first sub-substrate provided so as to be parallel with a plane of the main substrate, and connected to the main substrate via connectors disposed on the front side and the rear side thereof, respectively, the first sub-substrate comprising first analog circuits provided on respective surfaces of the front half region thereof, and first digital circuits provided on respective surfaces of the rear half region thereof, and electrically connected to the first analog circuits, respectively, wherein an analog test is conducted by the first analog circuits, and the first digital circuits, and a second sub-substrate provided on a plane of the main substrate, on a side thereof, opposite from the first sub-substrate, so as to be parallel with the plane of the main substrate, and connected to the main substrate via connectors disposed on the front side and the rear side thereof, respectively, the second sub-substrate comprising second analog circuits provided on respective surfaces of the front half region thereof, and second digital circuits provided on respective surfaces of the rear half region thereof, and electrically connected to the second analog circuits, respectively, wherein an analog test is conducted by the second analog circuits, and the second digital circuits.

The first and second analog circuits are preferably provided with first shield cases electrically connected at the grounds thereof on the first and second sub-substrate, for analog testing, respectively, thereby executing shielding while the first and second digital circuits are preferably provided with second shield cases electrically connected at the grounds thereof on the first and second sub-substrate, for digital testing, respectively, thereby executing shielding.

A power supply unit for supplying power to the first and second analog circuits, and the first and second digital circuits is preferably provided on the rear side of the main substrate, and a bus•interface connected to a bus of the test head is preferably provided on the rear side of the main substrate.

The first analog circuits, together with the first digital circuits, may make up a waveform generation unit for outputting the analog signal, and the second analog circuits, together with the second digital circuits, may make up a waveform measurement unit for measuring the analog signal.

The test head preferably executes either transmission, or receipt of a digital signal against the analog test module, or the device under test, and a plurality of test modules as digital test modules for executing a digital test of the device under test are preferably mounted on the test head so as to be parallel with each other.

With the invention, advantageous effects are gained as follows.

Since the main substrate is not provided with circuits where the analog test is conducted, but the digital circuits, and analog circuits are provided on both surfaces of the sub-substrates, respectively, thereby conducting the analog test, a sufficient installation area can be secured, thereby enabling the flexibility of the test head to be maintained.

Further, the digital circuits, and the analog circuits, that is, the circuits where the analog test is conducted, are mounted on the same first sub-substrate or the same second sub-substrate without passing through the respective connectors, so that signal transmission in the respective digital circuits, and the respective analog circuits can be effected with ease, and it is possible to prevent an increase in the number of signals transmitted between the main substrate and the respective connectors, thereby enabling the installation area to be secured.

Further, since the main substrate ends up serving as a shield, even if the circuits on the first and second sub-substrates, respectively, on one side of the main substrate, are in operation, it is possible to prevent noises from having effects on the first and second sub-substrates, respectively, on the other side of the main substrate.

Still further, the respective grounds of the analog circuits, and the digital circuits, on the first and second sub-substrates, respectively, are separated from each other, so that there is no possibility of ground bounce occurring to the digital circuits to propagate to the ground of the analog circuits, thereby preventing the ground•bounce from having an effect on the analog circuits.

Furthermore, since the waveform generation unit, and the waveform measurement unit are made up in the first and second sub-substrates, respectively, so as to be separated from each other, released heat will undergo dispersion, thereby preventing occurrence of heat joining therebetween, and controlling rise in temperature.

PREFERRED EMBODIMENTS OF THE INVENTION

Figure 1A:
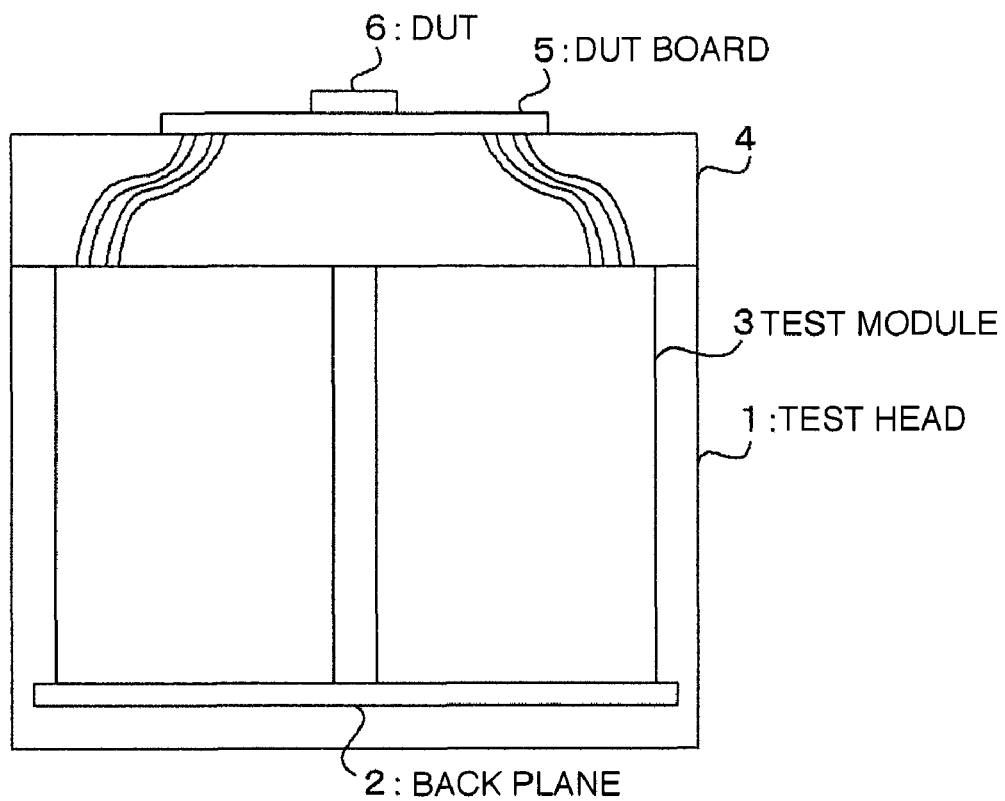
FIGS. 1 (A) and 1 (B) each are a conceptual view showing a configuration of an embodiment of the invention.
Figure 1B:
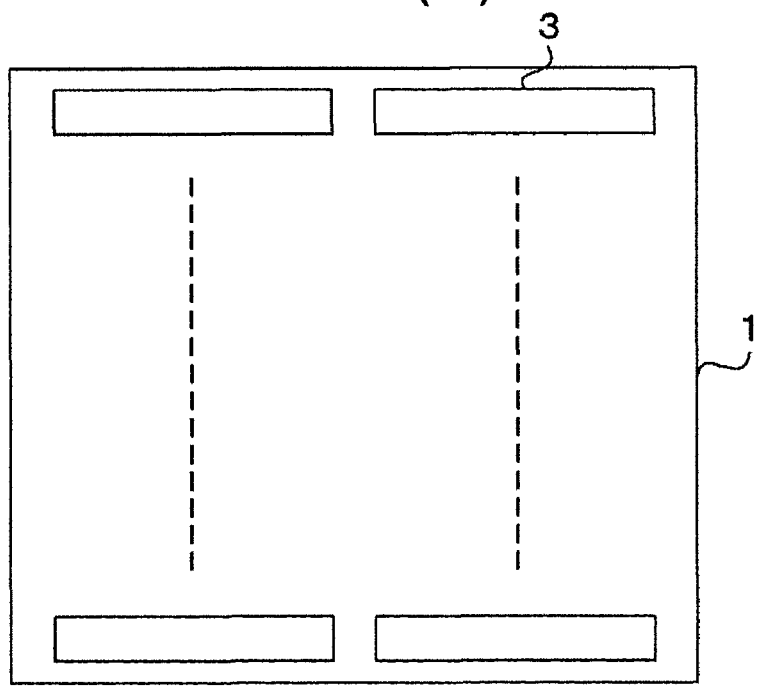
Figure 2:
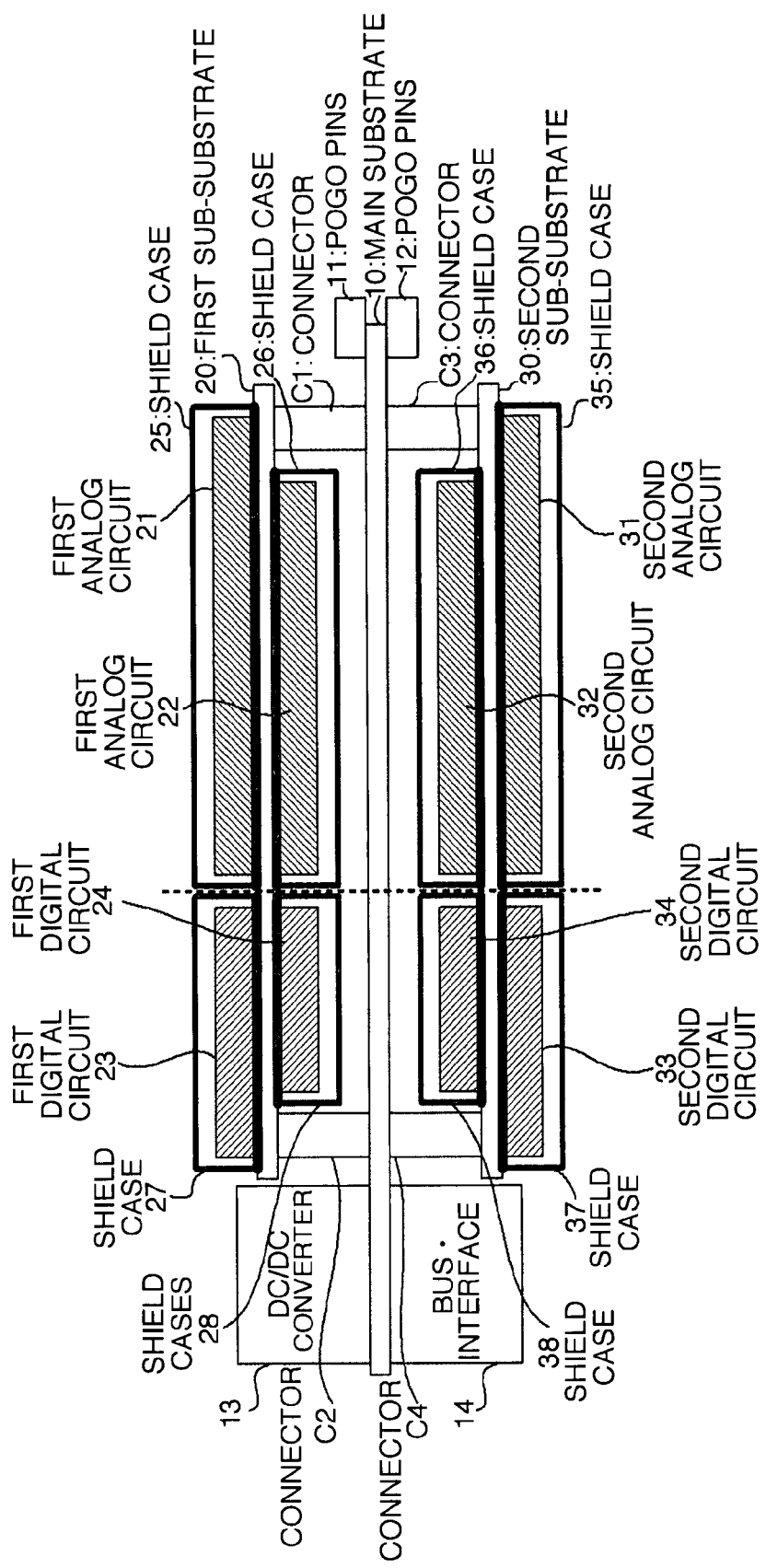
FIG. 2 is a schematic view showing principal parts of the embodiment of the invention.

The invention is described in detail hereinafter with reference to the accompanying drawings. FIG. 1 is a conceptual view showing a configuration of an embodiment of the invention, in which FIG. 1 (A) is a sectional view showing a side surface thereof, and FIG. 1 (B) is a sectional view showing a top surface thereof. FIG. 2 is a schematic view showing principal parts thereof.

In FIGS. 1 (A), and 1 (B), a test head 1 comprises a back plane 2, and a plurality of test modules 3 lined up in two parallel rows, mounted thereon. The test modules 3 are electrically connected to the back plane 2, including a digital test module, and an analog test module. A digital test is conducted at the digital test module while an analog test is conducted at the analog test module. A DUT interface 4 is mounted on the upper part of the test head 1 so as to be electrically connected to each of the test modules 3. A DUT board 5 having a socket or a probe is electrically connected to the DUT interface 4. A DUT 6 is an IC, an LSI, or the like, and is electrically connected to the DUT board 5.

Now, there is described the analog test module of the test module 3 hereinafter with reference to FIG. 2.

In FIG. 2, a main substrate 10 is provided with pogo pins 11, 12, positioned at the front end thereof, respectively, and is further provided with a DC/DC converter 13, and a bus interface 14, positioned at the rear end thereof, respectively, the rear end of the main substrate 10 being connected to the back plane. The pogo-pin 11 is electrically connected to the DUT interface 4. The DC/DC converter 13 is a power supply unit, and is electrically connected to the back plane. The bus•interface 14 is electrically connected to the back plane.

A first sub-substrate 20 is provided so as to be parallel with a plane of the main substrate 10, and connected to the main substrate 10 via connectors C1, C2, disposed on the front side and the rear side thereof, the first sub-substrate 20 comprising first analog circuits 21, 22, provided on respective surfaces of the front half region thereof, and first digital circuits 23, 24 provided on respective surfaces of the rear half region thereof, and electrically connected to the first analog circuits 21, 22, respectively. The first analog circuits 21, 22 are electrically connected to the pogo-pin 11 via the connector C1, and power from the DC/DC converter 13 is fed thereto. The first digital circuits 23, 24 are electrically connected to the bus interface 14 via the connector C2, and power from the DC/DC converter 13 is fed thereto. Shield cases 25, 26 are made up so as to cover the first analog circuits 21, 22, respectively, and are electrically connected to the ground of first analog circuits 21, 22 on the first sub-substrate 20, thereby fulfilling a shielding function. Similarly, shield cases 27, 28 are made up so as to cover the first digital circuits 23, 24, respectively, and are electrically connected to the grounds of the first digital circuits 23, 24 on the first sub-substrate 20, thereby fulfilling a shielding function. Herein, the first analog circuits 21, 22, together with the first digital circuits 23, 24, make up a waveform generation unit.

A second sub-substrate 30 is provided on a plane of the main substrate 10, on a side thereof, opposite from the first sub-substrate 20, so as to be parallel with the plane of the main substrate 10, and connected to the main substrate 10 via connectors C3, C4, disposed on the front side and the rear side thereof, the second sub-substrate 30 comprising second analog circuits 31, 32, provided on respective surfaces of the front half region thereof, and second digital circuits 33, 34, provided on respective surfaces of the rear half region thereof, and electrically connected to the second analog circuits 31, 32, respectively. The second analog circuits 31, 32 are electrically connected to the pogo-pin 12 via the connector C3, and power from the DC/DC converter 13 is fed thereto. The second digital circuits 33, 34 are electrically connected to the bus•interface 14 via the connector C4, and power from the DC/DC converter 13 is fed thereto. Shield cases 35, 36 are made up so as to cover the analog circuits 31, 32, respectively, and are electrically connected to the grounds of the analog circuits 31, 32 on the second sub-substrate 30, thereby fulfilling a shielding function. Similarly, shield cases 37, 38 are made up so as to cover the second digital circuits 33, 34, respectively, and are electrically connected to the grounds of the second digital circuits 33, 34 on the second sub-substrate 30, thereby fulfilling a shielding function. Herein, the second analog circuits 31, 32, together with the second digital circuits 33, 34, make up a waveform measurement unit.

The operation of the instrument described as above is described hereinafter.

Power is supplied from a power supply unit (AC/DC converter) (not shown) to the test head 1 to be subsequently fed to the test modules 3 via the back plane 2. The bus•interface 14 delivers the power from the back plane 2 to the DC/DC converter 13. The DC/DC converter 13 imparts a DC voltage to the first analog circuits 21, 22 of the sub-substrate 20, via the connector C1, and the second analog circuits 31, 32 of the sub-substrate 30, via the connector C3, respectively. Further, the DC/DC converter 13 imparts a DC voltage to the first digital circuits 23, 24 of the sub-substrate 20, via the connector C2, and the second digital circuits 33, 34 of the sub-substrate 30, via the connector C4, respectively. Herein, with the DC/DC converter 13, a power supply for imparting power to the analog circuits of the sub-substrates 20, 30, respectively, is separated from a power supply for imparting power to the digital circuits of the sub-substrates 20, 30, respectively.

Then, a controller (not shown) issues an instruction for testing the DUT 6 to the test head 1. The instruction for testing is delivered to the respective test modules 3 via the back plane 2. The digital test module of the test module 3 imparts a test signal to the DUT 6 via the DUT interface 4, and the DUT board 5. Further, an output from the DUT 6 is inputted to the digital test module of the test module 3 via the DUT board 5, and the DUT interface 4. The digital test module of the test module 3 outputs a result of determination on the output from the DUT 6 to the controller (not shown) via the back plane 2.

Meanwhile, with the analog test module, the instruction for testing, received from the back plane 2, is inputted to the bus•interface 14. The bus•interface 14 imparts the instruction for testing to the digital circuits 23, 24, 33 and 34, via the connectors C2, C4, respectively. The digital circuits 23, 24, together with the analog circuits 21, 22, generate an analog signal, and the analog signal is outputted via the connector C1 and the pogo-pin 11 to pass through the DUT interface 4, and the DUT board 5, thereby imparting the analog signal to the DUT 6. The digital circuits 33, 34, together with the analog circuits 31, 32 receive the analog signal outputted by the DUT 6, passing the DUT board 5, and the DUT interface 4, via the pogo-pin 11, thereby conducting measurement. Then, the digital circuits 33, 34 output a result of the measurement to the back plane 2 via the connector C4, and the bus•interface 14, thereby outputting the result of the measurement to the controller (not shown).

Thus, the main substrate 10 is not provided with circuits where the analog test is conducted, but the digital circuits, and analog circuits are provided on both surfaces of the sub-substrates 20, 30, respectively, thereby conducting the analog test, so that a sufficient installation area can be secured in each of the test modules 3, thereby enabling flexibility against the digital test module to be maintained.

Furthermore, the digital circuits, and the analog circuits, that is, the circuits where the analog test is conducted, are mounted on the same sub-substrate 20, or 30, without passing through the connectors C1 to C4, respectively, so that signal transmission in the respective digital circuits, and the respective analog circuits can be effected with ease, and it is possible to prevent an increase in the number of signals transmitted between the main substrate 10 and each of the connectors C1 to C4, thereby enabling the installation area to be secured.

Further, since the main substrate 10 ends up serving as a shield, even if the circuits on the sub-substrates 20, 30, respectively, on one side of the main substrate 10, are in operation, it is possible to prevent noises from having effects on the sub-substrates 20, 30, respectively, on the other side of the main substrate 10.

Still further, the respective grounds of the analog circuits, and the digital circuits, on the sub-substrates 20, 30, respectively, are separated from each other, so that there is no possibility of ground•bounce occurring to the digital circuits to propagate to the ground of the analog circuits, thereby preventing the ground•bounce from having an effect on the analog circuits.

Furthermore, since the waveform generation unit, and the waveform measurement unit are made up in the sub-substrates 20, 30, respectively, so as to be separated from each other, released heat will undergo dispersion, thereby preventing occurrence of heat joining therebetween, and controlling rise in temperature.

What is claimed is:

1. An IC tester for testing a device under test, comprising an analog test module for testing an analog signal against the device under test, mounted in a test head, said analog test module comprising:
    a main substrate, the front end thereof being electrically connected to the device under test;
    a first sub-substrate provided so as to be parallel with a plane of the main substrate, and connected to the main substrate via connectors disposed on the front side and the rear side thereof, respectively, the first sub-substrate comprising first analog circuits provided on respective surfaces of the front half region thereof, and first digital circuits provided on respective surfaces of the rear half region thereof, and electrically connected to the first analog circuits, respectively, wherein an analog test is conducted by the first analog circuits, and the first digital circuits; and
    a second sub-substrate provided on a plane of the main substrate, on a side thereof, opposite from the first sub-substrate, so as to be parallel with the plane of the main substrate, and connected to the main substrate via connectors disposed on the front side and the rear side thereof, respectively, the second sub-substrate comprising second analog circuits provided on respective surfaces of the front half region thereof, and second digital circuits provided on respective surfaces of the rear half region thereof, and electrically connected to the second analog circuits, respectively, wherein an analog test is conducted by the second analog circuits, and the second digital circuits.

2. The IC tester according to claim 1, wherein the first and second analog circuits are provided with first shield cases electrically connected at the grounds thereof on the first and second sub-substrate, for analog testing, respectively, thereby executing shielding while the first and second digital circuits are provided with second shield cases electrically connected at the grounds thereof on the first and second sub-substrate, for digital testing, respectively, thereby executing shielding.

3. The IC tester according to claim 1 or 2, further comprising a power supply unit for supplying power to the first and second analog circuits and the first and second digital circuits being provided on the rear side of the main substrate, and a bus interface connected to a bus of the test head being provided on the rear side of the main substrate.

4. The IC tester according to claim 1 or 2, wherein the first analog circuits, together with the first digital circuits, make up a waveform generation unit for outputting the analog signal, and the second analog circuits, together with the second digital circuits, make up a waveform measurement unit for measuring the analog signal.

5. The IC tester according to claim 1 or 2, wherein the test head executes either transmission, or receipt of a digital signal against the analog test module, or the device under test, and a plurality of test modules as digital test modules for executing a digital test of the device under test are mounted on the test head so as to be parallel with each other.

\* \* \* \* \*